(12) United States Patent
Hammerschmidt

(10) Patent No.: US 11,581,902 B2
(45) Date of Patent: Feb. 14, 2023

(54) PULSE WIDTH MODULATION GENERATED BY A SIGMA DELTA LOOP

(71) Applicant: Infineon Technologies AG, Neubiberg (DE)

(72) Inventor: Dirk Hammerschmidt, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 147 days.

(21) Appl. No.: 17/003,147

(22) Filed: Aug. 26, 2020

(65) Prior Publication Data

US 2022/0069838 A1    Mar. 3, 2022

(51) Int. Cl.
| | |
|---|---|
| *H03K 7/00* | (2006.01) |
| *H03M 3/00* | (2006.01) |
| *H02P 27/08* | (2006.01) |
| *H03K 7/08* | (2006.01) |
| *H03K 5/08* | (2006.01) |

(52) U.S. Cl.
CPC ............ *H03M 3/436* (2013.01); *H02P 27/08* (2013.01); *H03K 5/086* (2013.01); *H03K 7/08* (2013.01)

(58) Field of Classification Search
None
See application file for complete search history.

(56) References Cited

U.S. PATENT DOCUMENTS

| | | | | |
|---|---|---|---|---|
| 7,259,704 | B2* | 8/2007 | Mallinson | H03M 3/344 341/143 |
| 7,403,144 | B1* | 7/2008 | Cruz-Albrecht | H03M 3/496 341/143 |
| 7,573,956 | B2* | 8/2009 | Lazar | H03M 3/504 375/216 |
| 8,223,052 | B1* | 7/2012 | Kong | H03M 3/3287 341/143 |
| 9,154,172 | B1* | 10/2015 | Cruz-Albrecht | H01Q 3/2682 |
| 10,425,100 | B1* | 9/2019 | Vaturi | H03M 3/43 |
| 10,566,992 | B2* | 2/2020 | Lesso | H03M 3/376 |
| 2007/0182609 | A1* | 8/2007 | Sayeh | G02F 7/00 341/143 |
| 2009/0091484 | A1* | 4/2009 | Weng | H03M 3/37 341/143 |

(Continued)

OTHER PUBLICATIONS

"Hysteresis Setting for Comparator", 2017, pp. 1-7, ROHM Co., Ltd. [Online] URL: http://rohmfs.rohm.com/en/products/databook/applinote/ic/amp_linear/comparator/gpl_cmp_hysteresis-e.pdf.

(Continued)

*Primary Examiner* — Tuan T Lam
(74) *Attorney, Agent, or Firm* — Harrity & Harrity, LLP

(57) ABSTRACT

A sigma delta (SD) pulse-width modulation (PWM) loop includes a loop filter implementing a linear transfer function to generate a loop filter signal, wherein the loop filter is configured to receive an input signal and a first feedback signal and generate the loop filter signal based on the input signal, the first feedback signal, and the linear transfer function; and a hysteresis comparator coupled to an output of the loop filter, the hysteresis comparator configured to receive the loop filter signal and generate a sigma delta PWM signal based on the loop filter signal, wherein the first feedback signal is derived from the sigma delta PWM signal.

24 Claims, 9 Drawing Sheets

(56) References Cited

U.S. PATENT DOCUMENTS

| | | | | |
|---|---|---|---|---|
| 2009/0128385 A1* | 5/2009 | Joshi | ............ | H04N 5/378 |
| | | | | 341/143 |
| 2012/0200437 A1* | 8/2012 | Moue | ............ | H03M 3/386 |
| | | | | 341/110 |
| 2015/0123828 A1* | 5/2015 | Alldred | ............ | H03M 3/442 |
| | | | | 341/143 |
| 2016/0142072 A1* | 5/2016 | Richter | ............ | H03M 3/356 |
| | | | | 341/143 |
| 2018/0109268 A1* | 4/2018 | Kong | ............ | H03M 3/422 |
| 2021/0399738 A1* | 12/2021 | Brule | ............ | H03M 3/458 |

OTHER PUBLICATIONS

Art Kay, Timothy Claycomb, "Comparator with Hysteresis Reference Design", TI Designs—Precision: Verified Design, 2013, pp. 1-23, [Online] URL: https://www.ti.com/lit/ug/tidu020a/tidu020a.pdf?ts=1598453461476&ref_url=https%253A%252F%252Fwww.google.com%252F.

* cited by examiner

PULSE WIDTH MODULATION GENERATED BY A SIGMA DELTA LOOP

BACKGROUND

The many applications for pulse-width modulation (PWM) include voltage regulation, power-level control, and motor control, just to name a few. Each PWM period (i.e., transmission cycle) includes a high time for the first portion of the PWM period followed by a low time for a second portion of the PWM period, or vice versa. The duration of the first and second portions are regulated by a pulse-width modulator, which is typically a PWM circuit or processor. In both states, the power consumption is low because in one state there is no current through the driver and in the other state there is a low switching resistance at the driver.

PWM is widely used to transmit sensor data due to its simplicity. However, it has a severe disadvantage which is the long time that is needed to transmit a single value. This latency issue increases exponentially with the required resolution of the data transmission. The reception of the data is significantly delayed with respect to the sampling time. This delay sets a restriction to the achievable speed of a control loop that utilizes the sensor data.

PWM signals approximate continuous analog signals by fast sequences of rectangular signals. A proper approximation of the signal requires a sufficient oversampling ration. The resulting spectrum of the approximated signal contains: (1) the carrier frequency and its harmonics, and (2) quantization noise due to the limited number of clocks belonging to a PWM cycle. The spectrum of the band limited approximated signal is of course also included. There should be a sufficient gap between the PWM carrier and the end of the signal band in order to allow a reconstruction of the signal with a low pass filter.

For example, FIG. 1A includes an input signal (top) and a digital PWM output signal (bottom). The duty cycle of the digital PWM output signal changes based on the value of the input signal with constant switching frequency. In particular, the duty cycle is highest at the zero-crossing of a sinusoidal input signal and lowest at the two extrema of the sinusoidal input signal.

FIG. 1B shows a signal spectrum of the digital PWM output signal shown in FIG. 1A. As can be seen by the signal spectrum, PWM causes relatively high level of harmonics of the carrier frequency of the PWM signal with the first harmonic being substantially equal or greater than the peak of the carrier frequency. The harmonics of the switching frequency repeat with a decreasing spectral density. These harmonics may be referred to as distortion harmonics. It is desirable to lower the spectral density of the distortion harmonics.

A know alternative to PWM is a sigma delta modulated signal which uses a loop filter to distributes the quantization noise over the complete spectrum according to a noise transfer function which is designed to shift quantization noise to high frequency where it can be easily be attenuated by filters. Its spectrum is significantly improved compared to the one of a PWM with respect to noise spectral density in the frequency range around the PWM switching frequency and maxima of higher frequency spectral components which are relevant for electromagnetic emissions. Unfortunately, it comes at a cost of a far higher number of transitions wherein the transition in an output stage cause a significant increase of the power consumption. Furthermore, the rising edges and falling edges can have different steepness since they are generated by pull up or pull down devices which do not match very accurately. This causes in increase inaccuracy of the approximated signal which is getting worse with an increasing number of edges.

Therefore, embodiments provided herein provide a pulse-width modulator and a PWM method that has a reduced spectral density of the distortion harmonics.

SUMMARY

Embodiments provide a sigma delta (SD) pulse-width modulation (PWM) loop includes a loop filter implementing a linear transfer function to generate a loop filter signal, wherein the loop filter is configured to receive an input signal and a first feedback signal and generate the loop filter signal based on the input signal, the first feedback signal, and the linear transfer function; and a hysteresis comparator coupled to an output of the loop filter, the hysteresis comparator configured to receive the loop filter signal and generate a sigma delta PWM signal based on the loop filter signal, wherein the first feedback signal is derived from the sigma delta PWM signal.

BRIEF DESCRIPTION OF THE DRAWINGS

Embodiments are described herein making reference to the appended drawings.

DETAILED DESCRIPTION

Figure 1A:
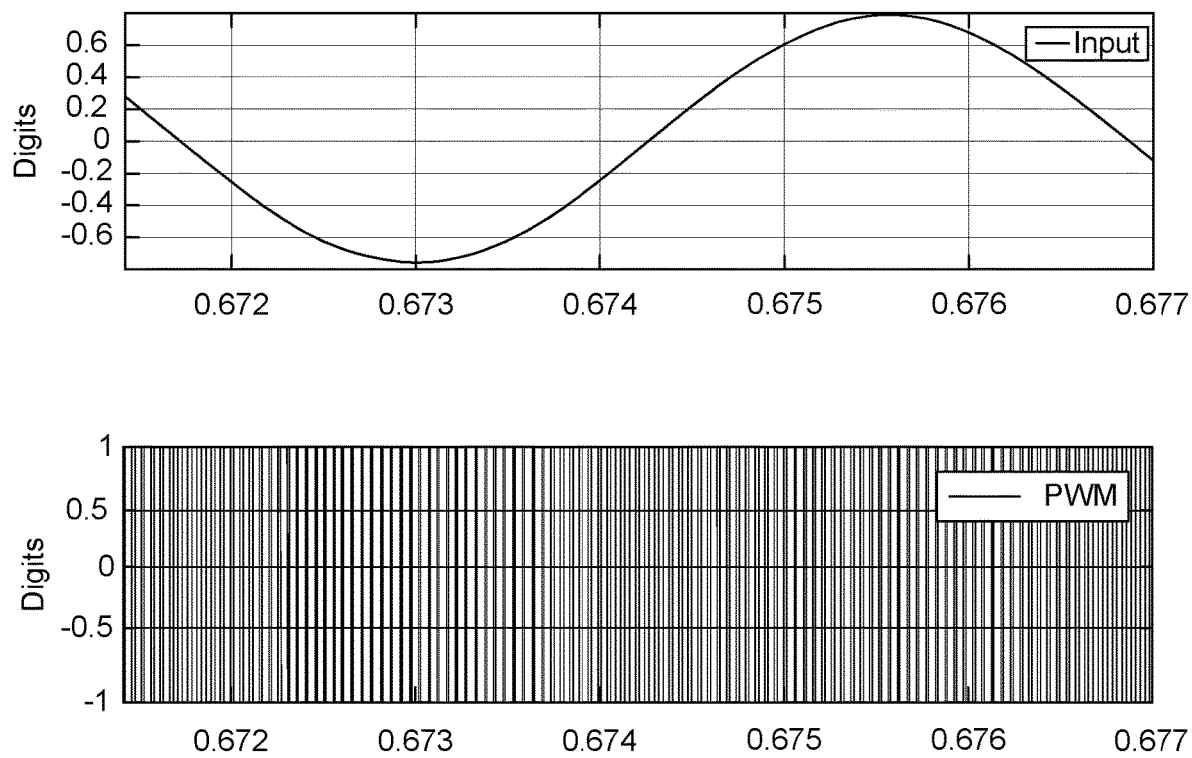
FIG. 1A includes an analog input signal (top) and a digital PWM output signal (bottom) of a conventional pulse width modulator (PWM)
Figure 1B:
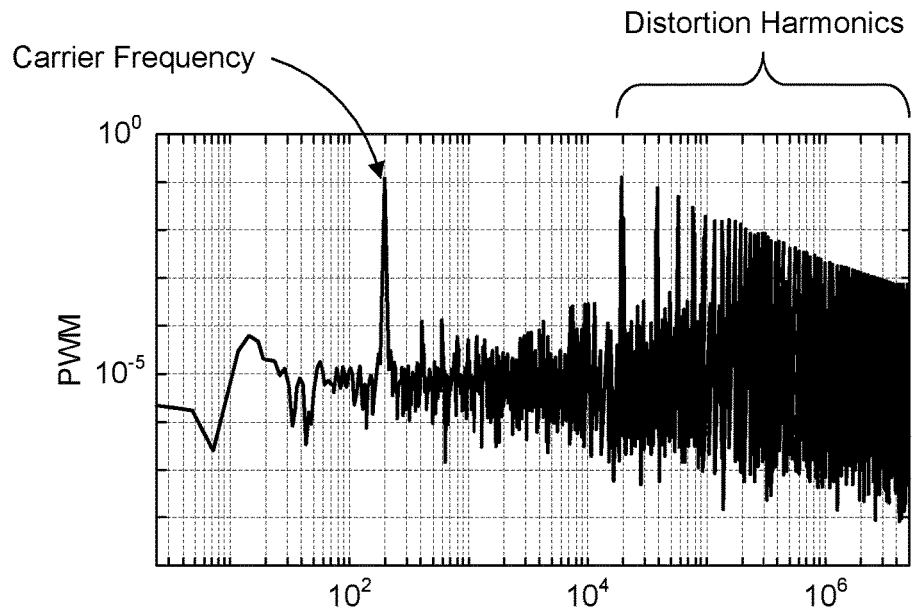
FIG. 1B shows a signal spectrum of the digital PWM output signal shown in FIG. 1A.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a CD-ROM, DVD, Blu-ray disc, a RAM, a ROM, a PROM, an EPROM, an EEPROM, a FLASH memory, or an electronic memory device.

Each of the elements of the present disclosure may be configured by implementing dedicated hardware or a software program on a memory controlling a processor to perform the functions of any of the components or combinations thereof. Any of the components may be implemented as a central processing unit (CPU) or other processor reading and executing a software program from a recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPGAs), programmable logic controller (PLC), or other equivalent integrated or discrete logic circuitry.

Accordingly, the term "processor," as used herein refers to any of the foregoing structures or any other structure suitable for implementation of the techniques described herein. A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

Figure 2A:
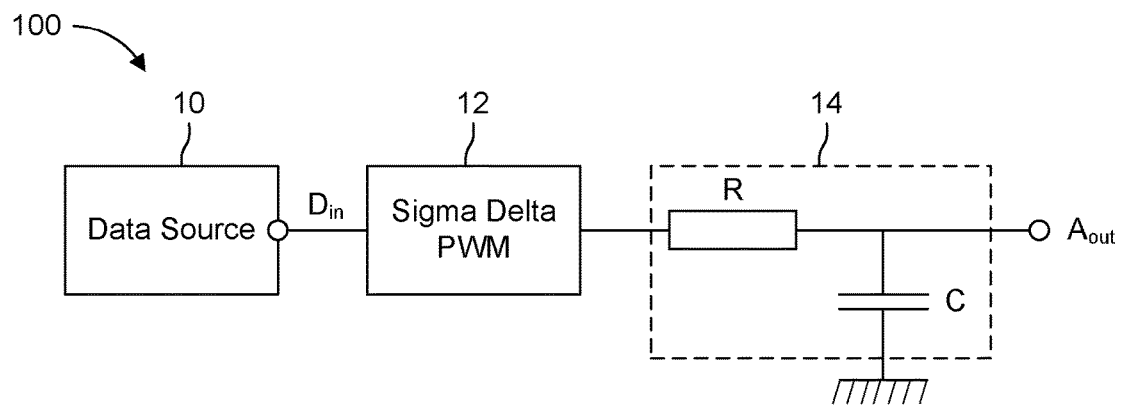
FIG. 2A is a schematic block diagram of a system in which a pulse-width modulator is used according to one or more embodiments.

FIG. 2A is a schematic block diagram of a system 100 in which a pulse-width modulator is used according to one or more embodiments. The system includes a data source 10, a sigma delta pulse-width modulator (SDPWM) 12, an RC circuit 14, and an analog output Aout. The data source 10 may be a sensor that is configured to generate a sensor signal (i.e., a data signal) in response to measuring a physical quantity such as temperature, pressure, magnetic field, voltage, current, etc. The SDPWM 12 includes an input Din that receives the sensor signal. The SDPWM 12 samples the sensor signal received at input Din at predetermined intervals, and generates a PWM signal based on the received data.

The RC circuit 14 is a low-pass filter (LPF) that converts the PWM signal into an analog signal. As such, an analog signal is output from the RC circuit 14 via the analog output Aout. The analog signal is an averaged signal representative of an average of multiple PWM periods or cycles.

The SDPWM 12 may be used to transmit data from a sensor to a microcontroller (not illustrated) of an electronic control unit (ECU). In this case, it is also used to replace an analog signal, which are extremely sensitive to electromagnetic interference (EMI) and thus require huge and expensive linear output drivers. The PWM signal is transmitted in binary coding using the SDPWM 12 and can be converted into an analog signal using the RC circuit 14 on the receiving side. The pulse-width modulator 12 drives the switching of the PWM signal to either voltage supply or ground and thus only needs minimal chip area compared to a linear output stage for the analog signal. Thus, the system 100 may be an output stage of communication interface.

Figure 2B:
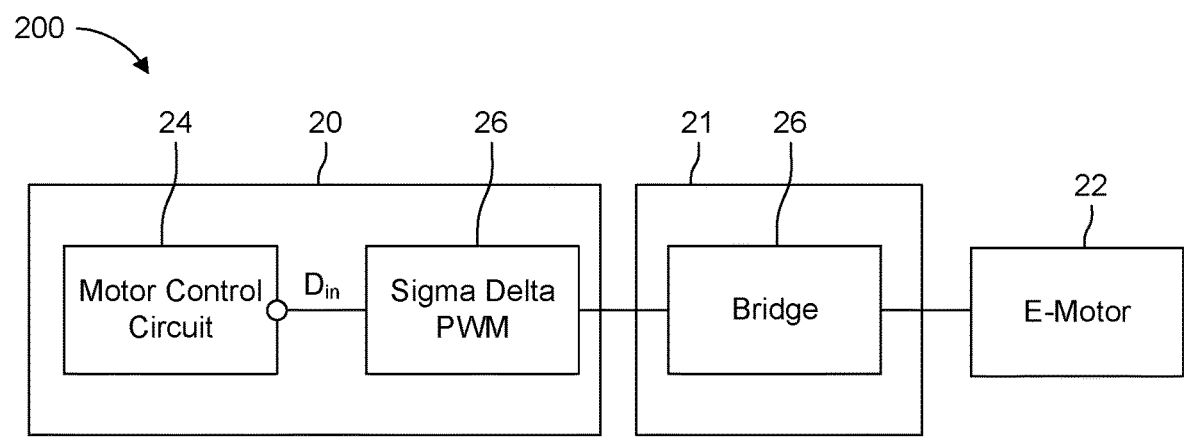
FIG. 2B is a schematic block diagram of another system in which a pulse-width modulator is used according to one or more embodiments.

FIG. 2B is a schematic block diagram of a system 200 in which a SDPWM is used according to one or more embodiments. The system 200 may include an inverter control unit 20, a power inverter 21, and an electric motor 22. The inverter control unit 20 behaves as a motor control unit for controlling the electric motor 22. The power inverter 21 may include a transistor bridge configured to, for example, provide three-phase power by supplying three phase voltages to drive the electric motor 22. The inverter control unit 20 includes a motor control circuit 24, such as microcontroller that implements a motor control algorithm, and a SDPWM 26 that transmits PWM control signals to a gate driver that controls the switching array of transistor bridge.

In this case, the motor control circuit 24 is a data source that generates a data signal in accordance with the motor control algorithm, and the data signal is received at the input Din of the SDPWM 26. The SDPWM 26 samples the data signal received at input Din at predetermined intervals, and generates a PWM control signal based on the received data. Thus, the system 200 may be an output stage used in power applications.

It is noted that a low pass filter that smooths the switched current signal is not needed since the smoothing is accomplished by the mechanical inertia of the electric motor 22.

Figure 3:
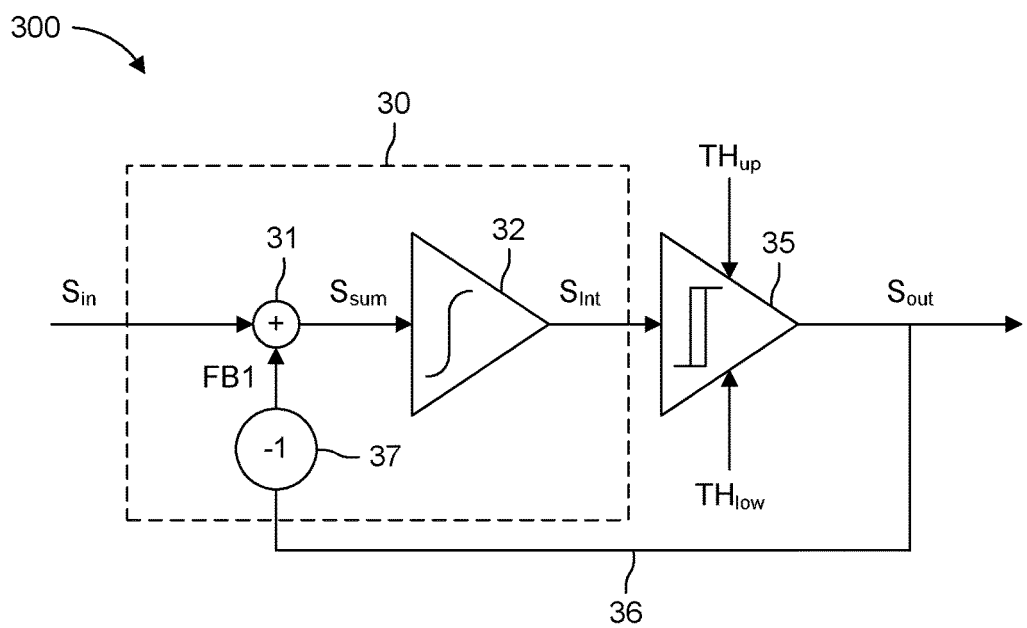
FIG. 3 is a schematic diagram of a sigma delta PWM according to one or more embodiments.

FIG. 3 is a schematic diagram of a sigma delta PWM 300 according to one or more embodiments. The sigma delta PWM 300 comprises a digital sigma delta loop (e.g., a first order sigma delta loop) that includes a loop filter 30, a digital hysteresis comparator 35, and a feedback path 36. The loop filter 30 receives an input signal Sin and a feedback signal FB (e.g., FB1) coming from the hysteresis comparator output and implements a linear transfer function. The hysteresis comparator 35 generates a sigma delta (SD) PWM signal as an output signal and the feedback signal FB is derived therefrom.

The loop filter 30 includes a digital summer 31, a digital integrator 32, and a digital inverter 37. In particular, the sigma delta PWM 300 comprises the digital summer 31, the digital integrator 32, the digital hysteresis comparator 35, and the feedback path 36 that includes the digital inverter 37. The inverter 37 multiplies the output of the sigma delta PWM 300, Sout, by a first feedback coefficient having a value of −1. Other types of inverters that invert the output signal Sout may also be used. It will also be appreciated that a digital subtractor could be used instead of the digital summer 31 to subtract the output signal Sout from the input signal Sin to generate a subtracted signal. In this case, the output signal Sout would be a feedback signal and the inverter 37 would not be needed.

The hysteresis comparator 35 generates a digital output signal Sout (i.e., a sigma delta PWM signal) that is toggled between a high or low value, where high represents a +1 and low represents a −1. Thus, the output of the inverter 37, feedback signal FB1, also toggles between a low or high value (i.e., −1 or 1) as the inverse of the digital output signal Sout. Likewise, an input signal Sin is a digital signal with a normalized amplitude having discrete values that are confined to the range of +/−1. It will be appreciated that the input signal is shown as normalized merely for easier understanding in the explanation and is not limited thereto.

The input signal Sin and a feedback signal FB1 are added by the summer 31. The feedback signal FB1 is the inversion of the output signal Sout generated by the hysteresis comparator 35. The integrator 32 receives a summed signal S1sum, which is the sum of the input signal Sin and the feedback signal FB1 generated by the summer 31, and generates an integrated signal S1int (i.e., a loop filter signal) based thereon. The hysteresis comparator 35 receives the integrated signal S1int and generates the output signal Sout based on a comparison of S1int to its two hysteresis thresholds THup and THlow.

A value of −1 at the input signal Sin leads to a permanent low (i.e., −1) at the output signal Sout for a sigma delta PWM period. Conversely, a value of +1 at the input signal Sin leads to a permanent high (i.e., +1) at the output signal Sout for a sigma delta PWM period. Values between −1 and +1 at the input signal Sin are represented by the duty cycle of the output signal Sout, specifically the high time/(high time+low time) with a variation from sigma delta PWM period. This means that even for a constant input value, high times and adjacent low times of adjacent sigma delta PWM period vary by some clock cycles depending of the history of the integrator states in the loop. This allows to achieve the intended noise shaping characteristic. It is a mixture of standard PWM without any noise shaping and the standard sigma delta architecture without noise shaping which has the highest relative variance with respect to the average length of the high and low states, which are much shorter than the ones of the sigma delta PWM.

The absolute value of the feedback signal FB1 is always equal to or larger than the absolute value of the signal amplitude of the input signal Sin. In particular, in the case of the first order sigma delta modulator shown in FIG. 3, the absolute value of the input signal Sin can be less than or equal to the absolute value of the feedback signal FB1. In the case that the input signal Sin is equal to the output signal Sout, the summed signal S1sum generated by the summer 31 will be 0 and the integrated signal S1int the integrator 32 does not change until the absolute value of the input signal Sin becomes less than the absolute value of the feedback signal FB1 (<1 for the normalized digital signal Sin).

However, for higher order loops, the absolute value of the feedback signal FB1 should always be greater than the absolute value of the input signal Sin. The higher the order of the loop, the higher the required margin. Typical values for second and third order loops are maximum (normalized) input amplitudes of 0.9 and 0.7, respectively. Thus, since the output value of the output signal is either +1 or −1, its absolute value will always be larger than the input amplitudes of the input signal Sin for second order or higher loops.

In cases where the sign of the feedback signal FB1 is the same as the sign of the input signal Sin, the integrated signal S1int is larger than in cases where the signs of input signal Sin and feedback signal FB1 are opposite.

Since the absolute value feedback signal FB1 is always equal to or larger than the absolute value of the input signal Sin, both cases (case 1 and case 2 below) have opposite signs. Case 1: sign(Sin)=Sign(FB1) results in large integration steps in a first direction dependent on the sign of both signals. Case 2: sign(Sin)=−Sign(FB1) results in smaller integration steps with opposite sign than in the first case under the assumption that the sign of input signal Sin is the same in both cases.

Consequently, the integrator 32 will integrate the summed signal S1sum up or down by a increment/decrement that is equal to sum or difference of the input signal Sin and the feedback signal FB1 depending on the hysteresis comparator output. Additionally, the integrator 32 will integrates with a different speed depending on the signs of the input signal Sin and the feedback signal FB1. The integration speed is faster in the case where the input signal Sin and the feedback signal FB1 have the same sign and is slower in the case that the signals have opposite signs. Consequently, the period to integrate up and down between the two thresholds THup and THlow of the hysteresis comparator 35 will be different depending on the value of the input signal Sin.

A hysteresis comparator 35 is operated by checking its input (i.e., integrated signal S1int) against an upper threshold value THup and a lower threshold value THlow. The upper threshold THup may be a positive value (greater than 1) and the lower threshold THlow may be a negative value (less than −1). The hysteresis of the comparator 35 is exactly the difference between the positive and the negative thresholds THup and THlow. The hysteresis comparator 35 has a large hysteresis of, for example, at least greater than the maximum amplitude of the input signal Sin. For example, for motor control, the hysteresis value may be at least 50 times the maximum amplitude of the input signal Sin may be used, but the hysteresis can differ depending on the clock of the integrator 32. The faster the integrator the higher the hysteresis for the same pseudo PWM frequency. Thus, if the maximum amplitude of the input signal Sin is 1, a hysteresis level 50 times that would provide an upper threshold value THup of 50 and a lower threshold value of THlow−50. Higher hysteresis levels greater than 100 times are possible depending on the application but would impact the switching frequency of the output signal Sout, as the switching frequency decreases as the hysteresis level increases.

The hysteresis comparator 35 checks the two thresholds separately and uses a logic to switch the sign of its output from plus (+) to minus (−) (e.g., from +1 to ~1) if the integrated signal S1int exceeds the positive threshold THup and it switches from minus (−) to plus (+) (e.g., from −1 to +1) if the integrated signal S1int falls below the negative threshold THlow. Thus, the hysteresis comparator 35 may include two comparators that perform the two threshold comparisons.

Turning back to the operation of the digital sigma delta modulator, if the input signal Sin is getting closer to the feedback limits [−1, 1] of the feedback signal FB1, the difference between the input signal Sin and the feedback signal FB1 is getting smaller and the time needed to integrate up to the threshold THup or THlow in the opposite direction of the sign of the input signal Sin is getting quite long. Therefore, the PWM period (i.e., the switching frequency of the PWM signal Sout) increases in these cases. As the difference between the input signal Sin and the feedback signal FB1 increases, the PWM period (i.e., the switching frequency of the PWM signal Sout) decreases. Thus, the PWM period of the output signal Sout varies based on the difference between the input signal Sin and the feedback signal FB1.

If the input signal Sin would reach the feedback value of the feedback signal FB1, the integrator state would not change anymore and thus the feedback would stay constant until the input signal Sin become less than the feedback signal FB1. Therefore, the input signal Sin must necessarily be limited to values within the feedback range of the feedback signal FB1. In other words, the absolute value feedback signal FB1 is always equal to or larger than the absolute value of the input signal Sin, which may depend on the order to the sigma delta modulator as described above. The feedback limits [−1, 1] of the feedback signal FB1 represent a maximum value and a minimum value of the feedback signal FB1. Since the output value Sout of the hysteresis comparator 35 toggles between +1 and −1, the feedback signal FB1 is likewise either −1 or +1. Naturally, any set of digital values can be used. For example, asymmetric values (e.g., 0 and 2) could also be used.

While the sigma delta PWM 300 is described as a digital circuit, it can alternatively be constructed from analog components. However, whether the sigma delta modulator is digital or analog is application dependent. Generally, if the input signal Sin is digital, then the sigma delta modulator will be digital.

Figure 4A:
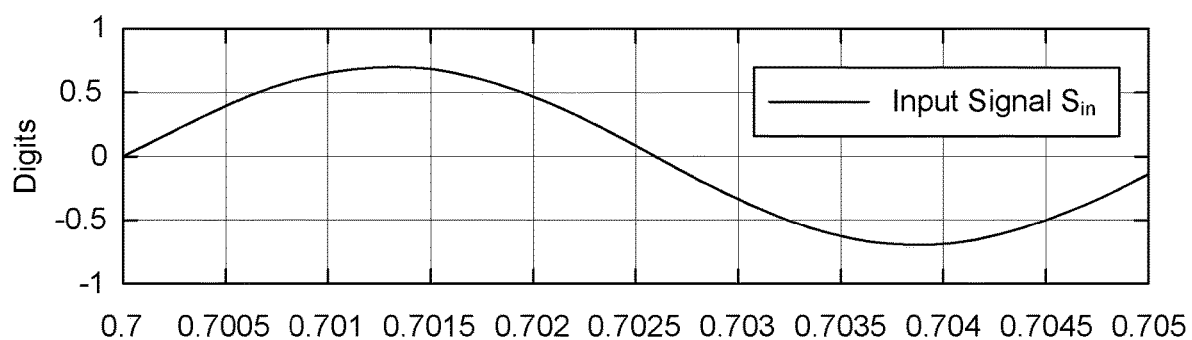
FIG. 4A includes an input signal Sin (top) and a sigma delta PWM output signal Sout (bottom) corresponding to the sigma delta PWM of FIG. 3.
Figure 4A:
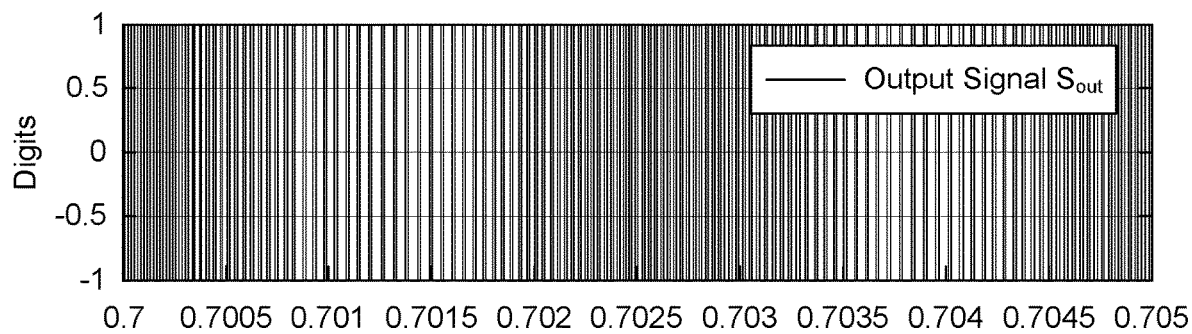

FIG. 4A includes an input signal Sin (top) and a sigma delta PWM output signal Sout (bottom) corresponding to the sigma delta PWM 300. The PWM period and the switching frequency of the output signal Sout changes based on the value of the input signal Sin. The switching frequency is highest (and the PWM period is lowest) when the input signal Sin is at zero and the switching frequency is lowest (and the PWM period is highest) when the input signal Sin is at its maximum or minimum amplitude. This change in the PWM period is non-linear as the input signal increases or decreases.

Figure 4B:
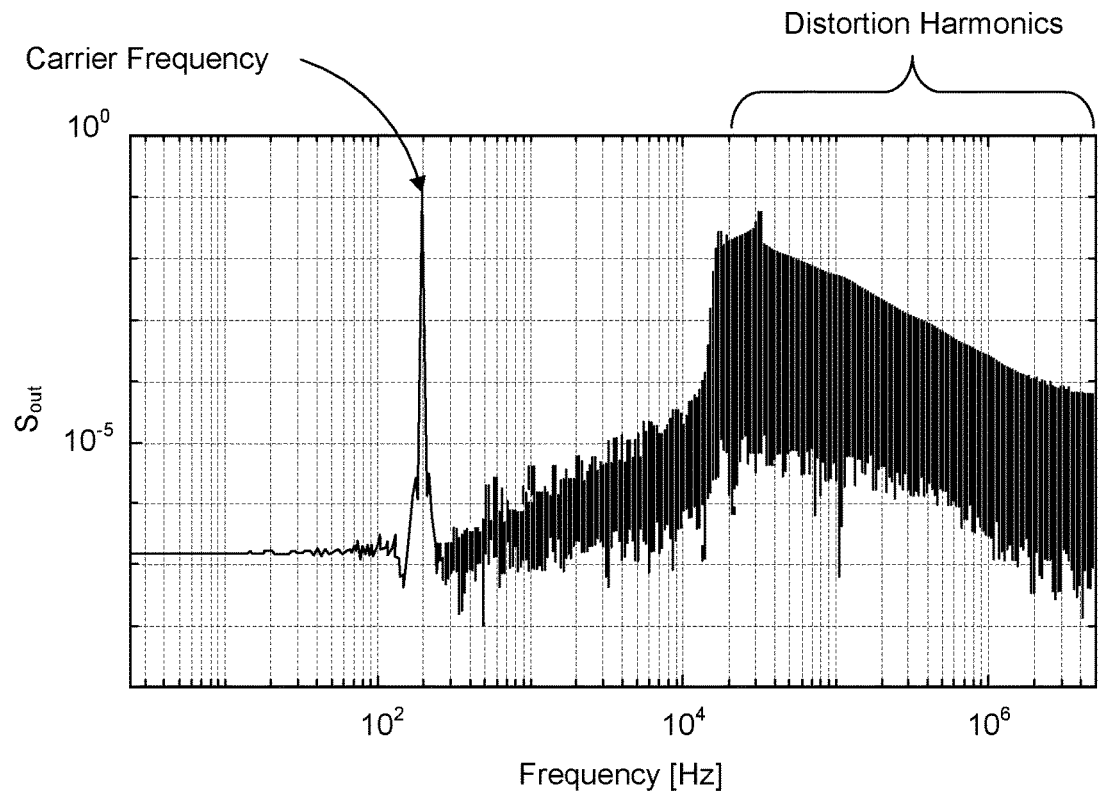
FIG. 4B shows a signal spectrum of an output signal Sout shown in FIG. 4A.

FIG. 4B shows a signal spectrum of the output signal Sout shown in FIG. 4A. As can be seen by the signal spectrum, a continuously decreasing high frequency spectrum with a maximum (peak) amplitude is produced that is lower than the sigma delta PWM harmonics (i.e., lower than the harmonics of the carrier frequency of the sigma delta PWM 100). Thus, the distortion spectrum compared to the PWM spectrum is improved.

Figure 5:
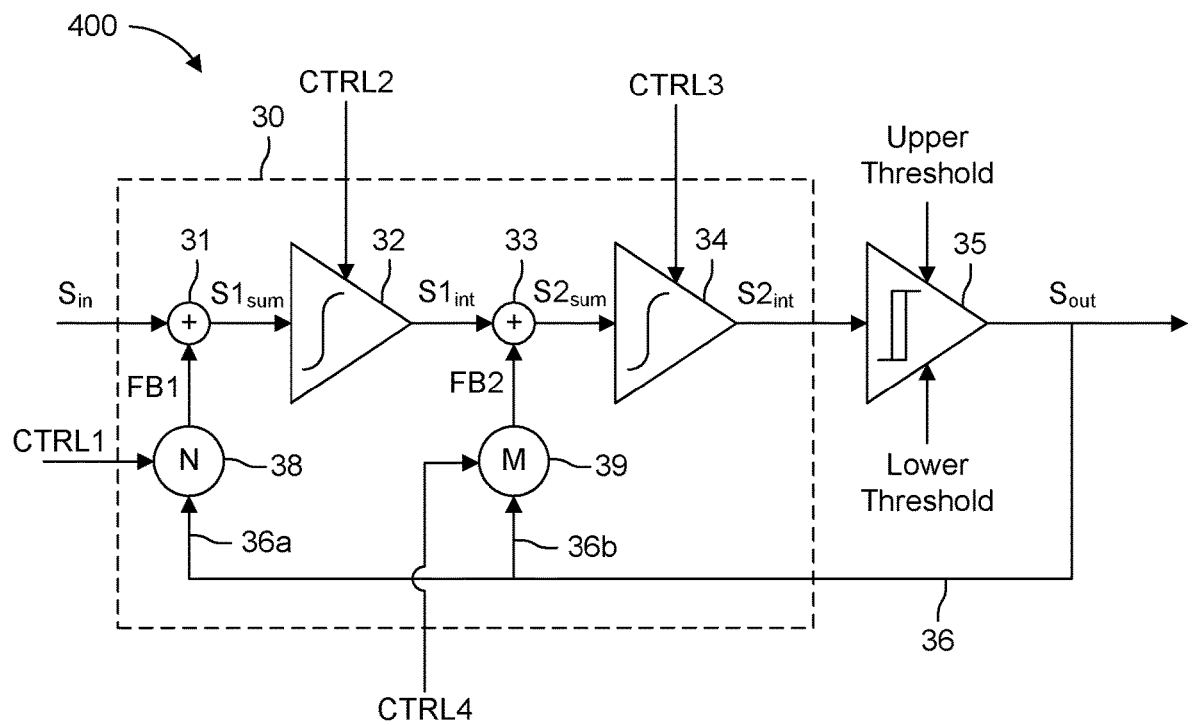
FIG. 5 is a schematic diagram of a sigma delta PWM according to one or more embodiments.

Higher order sigma delta loops may be used to get a steeper noise shaping transfer function. FIG. 5 is a schematic diagram of a sigma delta PWM 400 according to one or more embodiments. The sigma delta PWM 400 comprises a second order digital sigma delta loop that includes a loop filter 30, a digital hysteresis comparator 35, and a feedback path 36 that splits into two branches. Typically, a second order loop has steeper noise shaping in comparison to a first order loop. The loop filter 30 receives an input signal Sin and two feedback signals FB1 and FB2 both coming from the hysteresis comparator output and implements a linear transfer function. The hysteresis comparator 35 generates an SD PWM signal as an output signal and the feedback signals FB1 and FB2 are derived therefrom.

The loop filter 30 includes the digital summer 31, the digital integrator 32 (i.e., a first digital integrator), a digital summer 33, a second digital integrator 34, a first digital coefficient multiplier 38, and a second digital coefficient multiplier 39.

The first digital coefficient multiplier 38 applies a first negative feedback coefficient N to the output signal Sout to generate a first feedback signal FB1. In the case that N is equal to −1, the first digital coefficient multiplier 38 may be an inverter. Alternatively, in the case that N is equal to +1, a digital subtractor could be used instead of the digital summer 31 to subtract the output signal Sout from the input signal Sin to generate a subtracted signal. In this case, the output signal Sout would be a feedback signal and the first digital coefficient multiplier 38 or inverter would not be needed.

More specifically, the sigma delta PWM 400 comprises the digital summer 31, the digital integrator 32, the digital hysteresis comparator 35, and the feedback path 36. The feedback path 36 splits into two feedback paths or loops 36a and 36b, both being coupled to the output of the hysteresis comparator 35 and both receiving the output signal Sout. The first feedback path 36a is similar to the feedback path described in FIG. 3. It includes the first digital coefficient multiplier 38 that applies a negative feedback coefficient having a value of N (e.g., −1). The second feedback path 36b is responsible for the stability of the sigma delta modulator and includes a second digital coefficient multiplier 39 that applies a second negative feedback coefficient M to the output signal Sout. The second negative feedback coefficient M is a negative value that may, for example, be set to a value from −2 to −0.25 times the hysteresis level. This would typically result in values from −1 to −10, and, more particularly, in values between −2 to −4. The second digital multiplier 39 receives the output signal Sout and multiplies it by its negative feedback coefficient M to generate a second feedback signal FB2.

The sigma delta PWM 400 further includes a second digital summer 33 and a second digital integrator 34 that are coupled in series between the first digital integrator 32 and the hysteresis comparator 35. If M is set to +1, the second summer 33 could be replaced with a subtractor and the second digital multiplier 39 could be removed.

The second summer 33 receives the first integrated signal S1int and the second feedback signal FB2 and sums them together to generate a second summed signal S2sum. The second summed signal S2sum is input to the second integrator 34, which generates a second integrated signal S2int (i.e., a loop filter signal) based thereon. The hysteresis comparator 35 receives the second integrated signal S2int and generates the output signal Sout based on a comparison of S2int to its two hysteresis thresholds THup and THlow using two separate comparisons in the manner described above. The output signal Sout is again either a value of +1 or −1 depending on whether the upper threshold THup is exceeded by the second integrated signal S2int or whether the second integrated signal S2int is less than the lower threshold THlow.

The second negative feedback coefficient M is set to a negative value that prevents the second integrator 34 from integrating up or down too fast, which could cause instability in the sigma delta loop. As noted above, values in the range of −2*hysteresis to −0.25*hysteresis for M would typically be sufficient to meet this criteria. However, it is conceivable that values outside of this range could be used depending on the application.

Together, the first integrator 32 and the second integrator 34 perform two integrations in series. The output of the first integrator 32 is larger and the feedback coefficient M for the input of the second integrator 34 may be increased depending on the chosen hysteresis of the comparator 35.

At least one additional control signal CTRL may be provided as an input to the loop filter 30 to modify the states and/or the transfer function of the loop filter. The modification of the states can be at least one of holding values constant, setting values to initial states, or overwriting values with new ones. The modification of the transfer function H can include at least one of changes of filter coefficients, the deactivation of one or more elements of the loop filter, or bypassing one or more elements of the loop filter.

Four control signals CTRL1, CTRL2, CTRL3, and CTRL4 are provided in this example. The control signals are generated by a controller that is configured to modify the states and/or the transfer function of the loop filter. For example, control signal CTRL1 may be provided to the first coefficient multiplier 38 to change the negative feedback coefficient N to adjust the conversion gain of the SD PWM loop, control signal CTRL2 may be provided to reset integrator 32, control signal CTRL3 may be provided to integrator 34 to hold its value to be constant, and control signal CTRL4 may be provided to the second coefficient multiplier 39 to change its negative feedback coefficient M to modify the noise shaping behavior of the SD PWM loop. One or more different types of control signals may be provided to each element of the loop filter 30 based on desired settings.

Figure 6A:
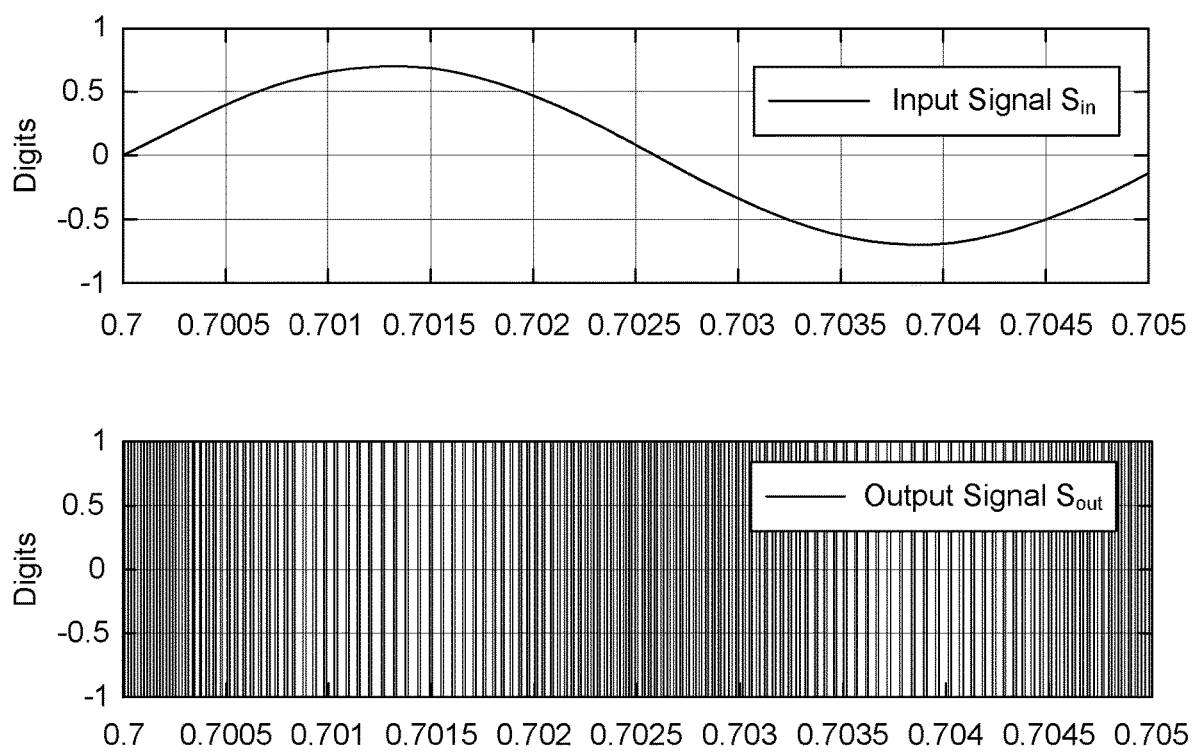
FIG. 6A includes an input signal Sin (top) and a sigma delta PWM output signal Sout (bottom) corresponding to the sigma delta PWM of FIG. 5.

FIG. 6A includes an input signal Sin (top) and a sigma delta PWM output signal Sout (bottom) corresponding to the sigma delta PWM 400. The PWM period and the switching frequency of the output signal Sout changes based on the value of the input signal Sin. The switching frequency is highest (and the PWM period is lowest) when the input signal Sin is at zero and the switching frequency is lowest (and the PWM period is highest) when the input signal Sin is at its maximum or minimum amplitude. This change in the PWM period is non-linear as the input signal increases or decreases.

Figure 6B:
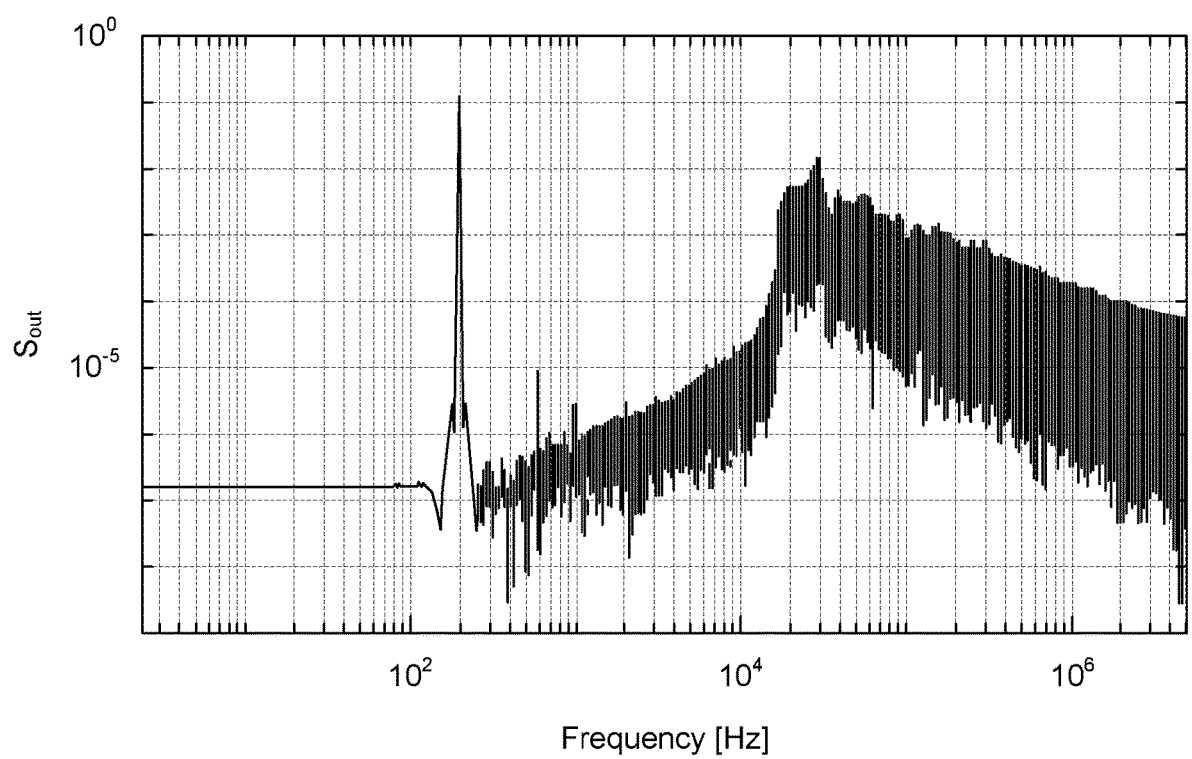
FIG. 6B shows a signal spectrum of an output signal Sout shown in FIG. 6A.

FIG. 6B shows a signal spectrum of the output signal Sout shown in FIG. 6A. As can be seen by the signal spectrum, a continuously decreasing high frequency spectrum with a maximum (peak) amplitude is produced that is lower than the sigma delta PWM harmonics (i.e., lower than the harmonics of the carrier frequency of the sigma delta PWM 400). Additionally, the distortion spectrum compared to the PWM spectrum and the first order sigma delta modulator 300 is improved. For instance, the spectrum clearly visualizes that the maximum of the higher frequency spectral densities is limited to about 1/10 of a conventional PWM spectrum (i.e., of the carrier frequency). Secondly, the noise spectral density in the lower frequency range around the sigma delta PWM output signal Sout (i.e., around the carrier frequency) is also decreased significantly according to the noise transfer function.

Figure 7:
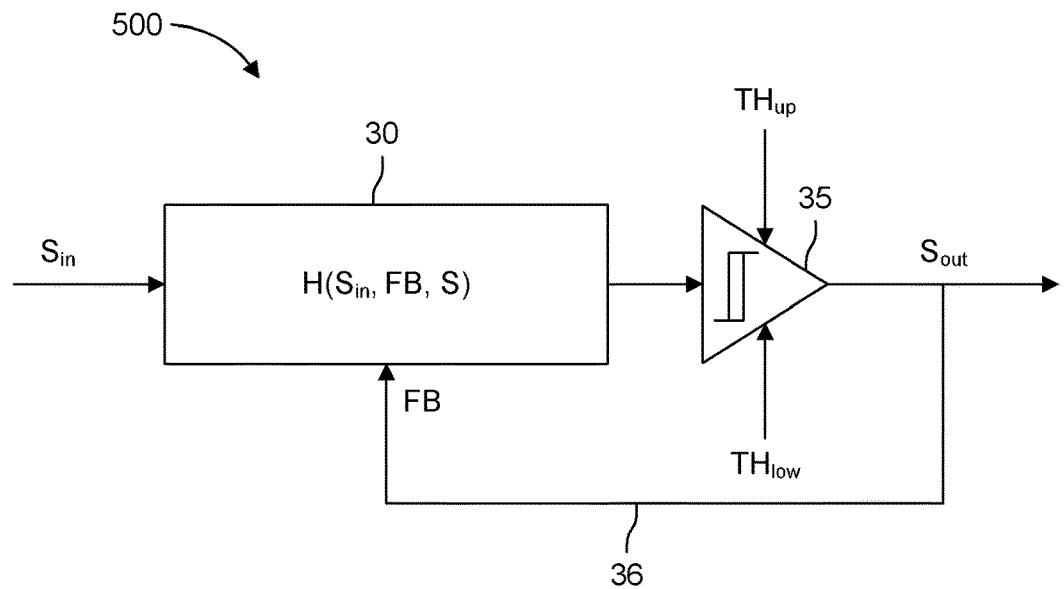
FIG. 7 is a generalized schematic block diagram of a sigma delta PWM modulator with a loop filter according to one or more embodiments.

It will be appreciated that loops of different order and architecture can be implemented and described in a generalized form using a transfer function (H) of the loop filter depending on its two inputs and the frequency variable of the spectral transform (s for Laplace transform in case of continuous time loop filters or z for z-transform transfer functions in case of discrete time loop filters). Therefore, FIG. 7 is a generalized schematic block diagram of a sigma delta PWM modulator 500, with a block 30 being representative of a transfer function H of the loop filter receiving the two inputs, the input signal Sin and the feedback signal FB. The transfer function H represents a loop filter of any order that feeds into the hysteresis comparator 35. The transfer function H may include at least one of: at least one integrator, at least one register (i.e., a signal delay unit), at least one coefficient multiplier, at least one inverter, at least one adder, or at least one subtractor. Signals inside the loop filter can be clamped (saturated) to values that are defined for maximum and minimum of states to avoid overflows.

The previously explained effect of increasing time, the PWM period, between different output states can be compensated by a forward control of the hysteresis level of the hysteresis comparator 35. That is, by using a forward control, the upper and lower hysteresis thresholds THup and THlow can be adjusted in order to reduce the high switching frequency (i.e., the low PWM period) when the input signal Sin is close to or at the zero-crossing. According to the following embodiment, the forward control uses the input signal Sin to make the adjustment to the upper and lower hysteresis thresholds THup and THlow.

Figure 8:
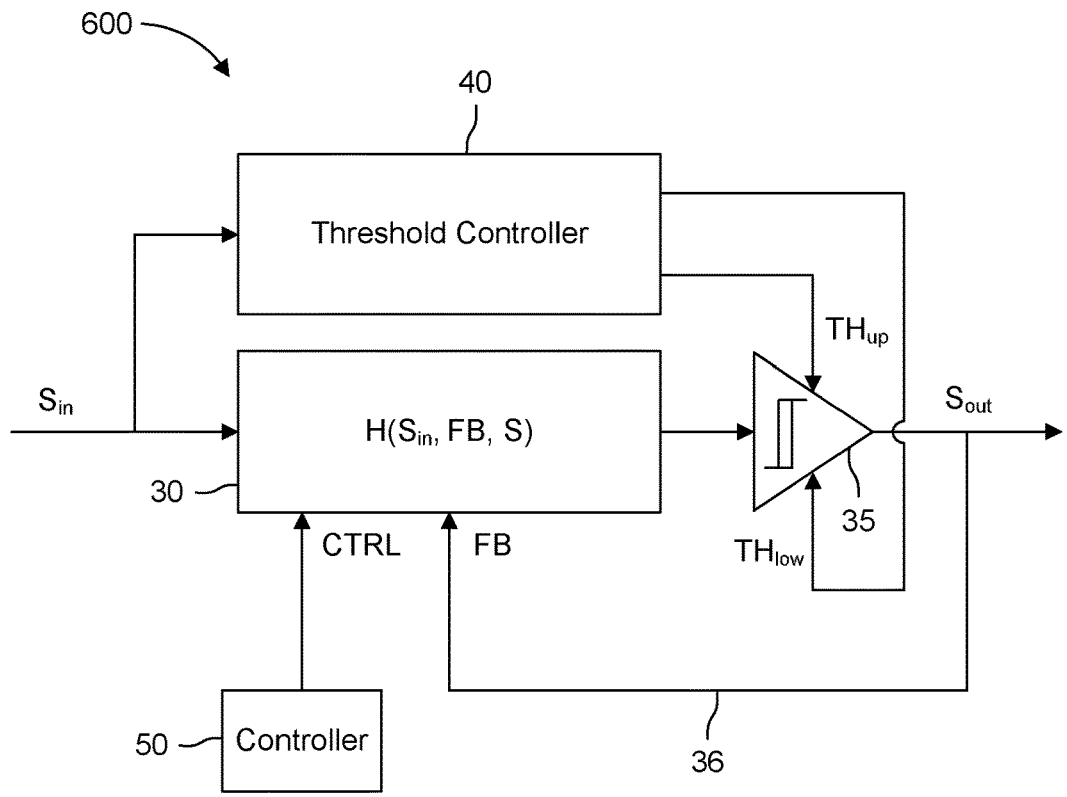
FIG. 8 is a schematic diagram of a sigma delta PWM according to one or more embodiments.

FIG. 8 is a schematic diagram of a sigma delta PWM 600 according to one or more embodiments. The sigma delta PWM 600 comprises loop filter block 30 being representative of the transfer function H of the loop filter receiving the two inputs, the input signal Sin and the feedback signal FB. The sigma delta PWM 600 further comprises the hysteresis comparator 35 with its hysteresis thresholds THup and THlow being adjustable based on control signals. The sigma delta PWM 600 further comprises a threshold controller 40 that receives the input signal Sin and adjusts the hysteresis level of the hysteresis comparator 35 via the control signals based on the input signal Sin. When the hysteresis level is increased, the magnitudes of the hysteresis thresholds THup and THlow are increased in equal but opposite directions. Conversely, when the hysteresis level is decreased, the magnitudes of the hysteresis thresholds THup and THlow are decreased.

In this case the hysteresis level can be set higher to reduce the number of transition edges of the output signal Sout when the input signal Sin is close to or at zero. Conversely, for higher input signals Sin, the hysteresis level can be proportionally decreased in order to avoid too long durations between edges. The proportionality factor or scaling factor for the hysteresis level can be used to adjust the ratio between the shortest and longest time between edges. This proportionality factor can be adjustable and programmable at the threshold controller 40.

In particular, when input signal is close to or at zero, the hysteresis level may be increased proportional to the absolute value of the input signal Sin. Thus, the hysteresis level is decreased with increasing amplitude of the input signal Sin, with the hysteresis level being at a minimum when the input signal Sin is at its maximum or minimum value, and the hysteresis level is increased with decreasing amplitude of the input signal Sin, with the hysteresis level being at a maximum when the input signal Sin is at the zero-crossing. With the increase of the hysteresis of the comparator 35, the PWM period of the output signal Sout automatically increases (i.e., switching frequency automatically decreases). Thus, the faster switching that occurs at or around zero can be reduced and the PWM period variance between its minimum and maximum values can be controlled by the proportionality factor implemented by the threshold controller 40. The forward control implemented by the threshold controller 40 further improves the spectrum of the sigma delta PWM output signal Sout.

At least one additional control signal CTRL may be provided as an input to the loop filter block 30 to modify the states and/or the transfer function of the loop filter. The modification of the states can be at least one of holding values constant, setting values to initial states, or overwriting values with new ones. The modification of the transfer function H can include at least one of changes of filter coefficients, the deactivation of one or more elements of the loop filter, or bypassing one or more elements of the loop filter.

The control functions that modify the states of the loop filter via one or more control signals CTRL are signaled by a controller 50, which may be an external control loop, and are intended to change the behavior of the SD PWM signal Sout in order to allow special functions. For example, undisturbed windows for external measurements where transients of the SD PWM shall be suppressed. This would be achieved by the hold function as described above. In another example, a soft reset may be sent which would reset all integrators in order to restart from scratch as an exception handling function for the external control loop, or as a safety function that can be initiated after a soft error was detected by a safety monitor of the external control loop. In another example, an overwrite of a value of the last integrator (e.g., integrator 34) with a value coming from the external controller 50 in order to force the SD PWM into a certain state (e.g., immediate forced high output, or low output at the SD PWM signal)

Additionally, or alternatively, the control functions that modify the transfer function of the loop filter 30 via one or more control signals CTRL are signaled by the controller 50. Examples of control functions that modify the transfer function of the loop filter, include, but are not limited to: bypass the second integrator 34 in order to change from a second order SD PWM loop to a first order SD PWM loop; change the coefficient M of the coefficient multiplier 38 to modify the noise shaping behavior of the SD PWM loop; and/or change the coefficient N of the coefficient multiplier 37 to modify the conversion gain of the SD PWM loop.

Figure 9A:
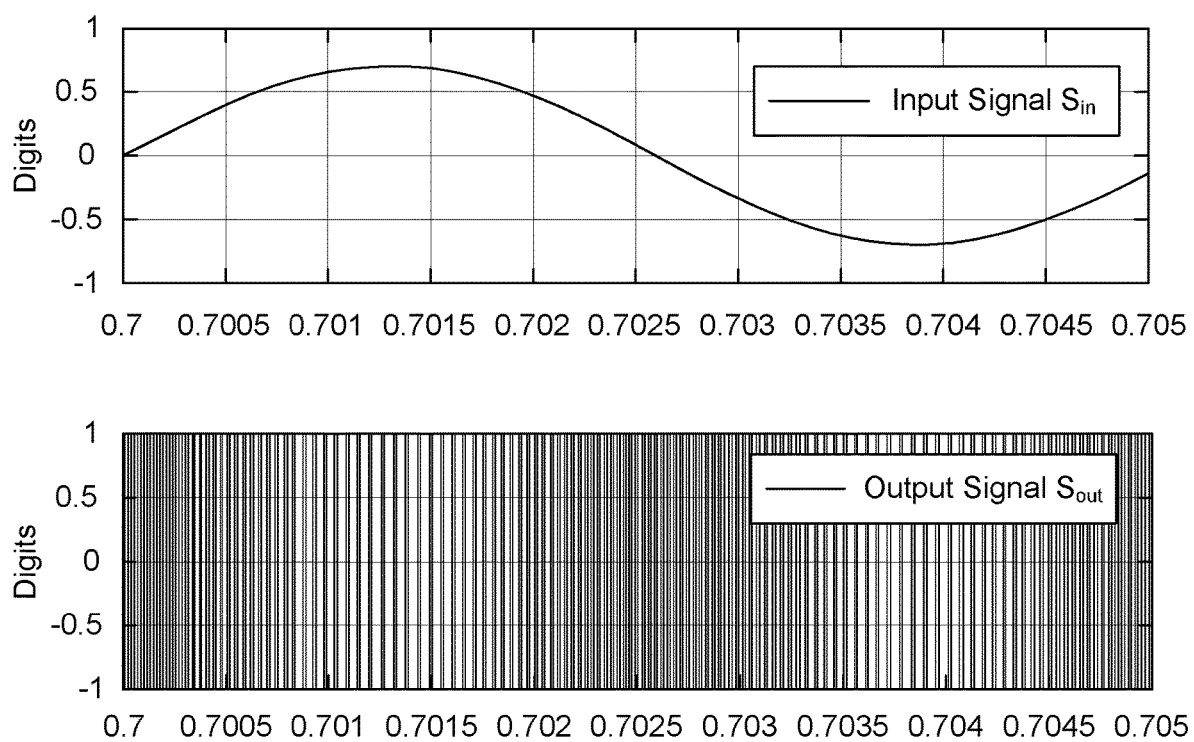
FIG. 9A includes an input signal Sin (top) and a sigma delta PWM output signal Sout (bottom) corresponding to the sigma delta PWM of FIG. 8.

FIG. 9A includes an input signal Sin (top) and a sigma delta PWM output signal Sout (bottom) corresponding to the sigma delta PWM 600. The PWM period and the switching frequency of the output signal Sout changes based on the value of the input signal Sin. The variance in the PWM period and the switching frequency of the output signal Sout may be reduced or eliminated by the threshold controller 40.

In cases where the variance is reduced but not eliminated, the switching frequency is controlled or limited by the threshold controller 40, the switching frequency is highest (and the PWM period is lowest) when the input signal Sin is at zero and the switching frequency is lowest (and the PWM period is highest) when the input signal Sin is at its maximum or minimum amplitude. This change in the PWM period is proportional to the input signal. However, here, the difference between the highest switching frequency and the lowest switching frequency in the output signal Sout has been reduced by dynamic adjustments made by the threshold controller 40.

In cases where the variance is eliminated, the PWM period and the switching frequency of the output signal Sout remains constant due to the dynamic adjustments made by the threshold controller 40.

Figure 9B:
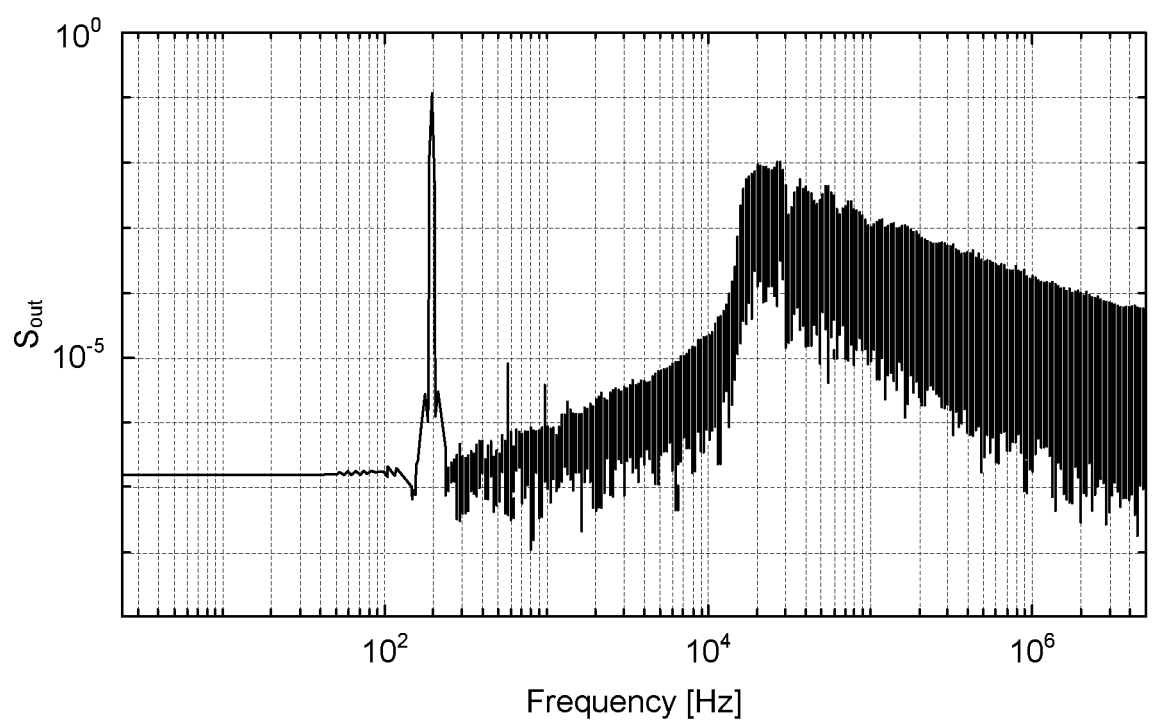
FIG. 9B shows a signal spectrum of the output signal Sout shown in FIG. 9A.

FIG. 9B shows a signal spectrum of the output signal Sout shown in FIG. 9A. As can be seen by the signal spectrum, a continuously decreasing high frequency spectrum with a maximum (peak) amplitude is produced that is lower than the sigma delta PWM harmonics (i.e., lower than the harmonics of the carrier frequency of the sigma delta PWM 600). Additionally, the distortion spectrum compared to the PWM spectrum and the first and the second order sigma delta modulators 300 and 400 is improved due to the forward control. For instance, the spectrum clearly visualizes that the maximum of the higher frequency spectral densities is less than those shown in FIGS. 4B and 6B.

Additional embodiments are provided below.

1. A pulse-width modulation (PWM) output stage, comprising:
a sigma delta loop comprising:
a first summer arranged at an input of the sigma delta loop, wherein the first summer is configured to receive an input signal and a first feedback signal, and generate a first summed signal based on a sum of the input signal and the first feedback signal;
at least one integrator configured to generate an integrated signal based on the first summed signal;
a hysteresis comparator arranged at an output of the sigma delta loop, wherein the hysteresis comparator is configured to receive the integrated signal and generate a sigma delta PWM signal based on comparing the integrated signal to a first hysteresis threshold and to a second hysteresis threshold; and
an inverter arranged on a first feedback path coupled between an output of the hysteresis comparator and the first summer, wherein the inverter is configured to receive the sigma delta PWM signal and generate the first feedback signal by inverting the sigma delta PWM signal.

2. The PWM output stage of embodiment 1, wherein the sigma delta loop is digital such that the first summer, the at least one integrator, the hysteresis comparator, and the inverter are digital.

3. The PWM output stage of embodiment 1, wherein the hysteresis comparator has a hysteresis level that is greater than a maximum amplitude of the input signal.

5. The PWM output stage of embodiment 1, wherein the sigma delta PWM signal is a digital signal that toggles between a value of +1 and −1, and wherein a duty cycle of the sigma delta PWM signal depends on a value of the input signal.

6. The PWM output stage of embodiment 1, wherein the sigma delta PWM signal has a variable PWM period that has a minimum duration when the input signal is at zero and has a maximum duration when the input signal is at its maximum or minimum amplitude.

7. The PWM output stage of embodiment 1, wherein the sigma delta PWM signal has a variable switching frequency that has a maximum frequency when the input signal is at zero and has a minimum frequency when the input signal is at its maximum or minimum amplitude.

8. The PWM output stage of claim 1, wherein an absolute value of the first feedback signal is always equal to or greater than an absolute value of the input signal.

9. The PWM output stage of claim 1, wherein the at least one integrator integrates faster on a first condition that the input signal and the first feedback signal have the same sign and integrates slower on a second condition that the input signal and the first feedback signal have opposite signs.

10. The PWM output stage of embodiment 1, wherein:
the hysteresis comparator has a hysteresis level that is greater than a maximum amplitude of the input signal, and
an absolute value of the first feedback signal is always equal to or greater than an absolute value of the input signal.

11. The PWM output stage of embodiment 1, wherein:
the at least one integrator includes a first integrator and a second integrator coupled in series between the first summer and the hysteresis comparator.

12. The PWM output stage of embodiment 11, wherein an absolute value of the first feedback signal is always greater than an absolute value of the input signal.

13. The PWM output stage of embodiment 11, wherein:
the sigma delta loop comprises a second summer arranged in series between the first integrator and the second integrator, and a multiplier arranged on a second feedback path between the output of the hysteresis comparator and the second summer,
the multiplier is configured to generate a second feedback signal by applying a negative coefficient to the sigma delta PWM signal.

14. The PWM output stage of embodiment 13, wherein the negative coefficient has a value within a range of −1 to −10.

15. The PWM output stage of embodiment 13, wherein:
the first integrator is configured to generate a first integrated signal based on the first summed signal,
the second summer is configured to receive the first integrated signal and the second feedback signal, and generate a second summed signal based on a sum of the first integrated signal and a second feedback signal,
the second integrator is configured to generate a second integrated signal based on the second summed signal, and
the hysteresis comparator is configured to receive the second integrated signal as the integrated signal and generate the sigma delta PWM signal based on comparing the second integrated signal to the first hysteresis threshold and to the second hysteresis threshold.

16. The PWM output stage of embodiment 1, further comprising:
a controller arranged on a forward control path coupled to the input of the sigma delta loop, wherein the controller is configured to receive the input signal and adjust the first hysteresis threshold and the second hysteresis threshold based on a value of the input signal.

17. The PWM output stage of embodiment 16, wherein:
the controller is configured to set absolute values of the first hysteresis threshold and the second hysteresis threshold to a maximum value in response to the value of the input signal being zero, and
the controller is configured to set the absolute values of the first hysteresis threshold and the second hysteresis threshold to a minimum value in response to the value of the input signal having a maximum or minimum amplitude.

18. The PWM output stage of embodiment 16, wherein the sigma delta PWM signal has a variable PWM period that has a minimum duration when the input signal is at zero and has a maximum duration when the input signal is at its maximum or minimum amplitude.

19. The PWM output stage of embodiment 17, wherein the controller is configured to dynamically set the absolute values of the first hysteresis threshold and the second hysteresis threshold such that the sigma delta PWM signal has a constant PWM period.

20. A pulse-width modulation (PWM) output stage, comprising:
a sigma delta loop comprising:
a subtractor arranged at an input of the sigma delta loop, wherein the subtractor is configured to receive an input signal and a first feedback signal, and subtract the first feedback signal from the input signal to generate a subtracted signal based on a difference between the input signal and the feedback signal;
at least one integrator configured to generate an integrated signal based on the first subtracted signal;
a hysteresis comparator arranged at an output of the sigma delta loop, wherein the hysteresis comparator is configured to receive the integrated signal and generate a sigma delta PWM signal based on comparing the integrated signal to a first hysteresis threshold and to a second hysteresis threshold; and a first feedback path coupled between an output of the hysteresis comparator and the subtractor, wherein the subtractor is configured to receive the sigma delta PWM signal as the first feedback signal via the first feedback path.

21. The PWM output stage of embodiment 20, wherein:
the hysteresis comparator has a hysteresis level that is greater than a maximum amplitude of the input signal, and
an absolute value of the first feedback signal is always equal to or greater than an absolute value of the input signal.

22. The PWM output stage of embodiment 20, wherein:
the at least one integrator includes a first integrator and a second integrator coupled in series between the subtractor and the hysteresis comparator.

23. The PWM output stage of embodiment 22, wherein:
the sigma delta loop comprises a summer arranged in series between the first integrator and the second integrator, and a multiplier arranged on a second feedback path between the output of the hysteresis comparator and the summer,
the multiplier is configured to generate a second feedback signal by applying a negative coefficient to the sigma delta PWM signal.

24. The PWM output stage of embodiment 23, wherein:
the first integrator is configured to generate a first integrated signal based on the subtracted signal,
the summer is configured to receive the first integrated signal and the second feedback signal, and generate a summed signal based on a sum of the first integrated signal and a second feedback signal,
the second integrator is configured to generate a second integrated signal based on the summed signal, and
the hysteresis comparator is configured to receive the second integrated signal as the integrated signal and generate the sigma delta PWM signal based on comparing the second integrated signal to the first hysteresis threshold and to the second hysteresis threshold.

25. The PWM output stage of embodiment 20, further comprising:
a controller arranged on a forward control path coupled to the input of the sigma delta loop, wherein the controller is configured to receive the input signal and adjust the first hysteresis threshold and the second hysteresis threshold based on a value of the input signal.

26. A pulse-width modulation (PWM) output stage, comprising:
a sigma delta loop comprising:
a loop filter configured to receive an input signal and a feedback signal derived from an output signal, and generate loop filter output signal based on a difference between the input signal and the feedback signal;
a hysteresis comparator arranged at an output of the sigma delta loop, wherein the hysteresis comparator is configured to receive the loop filter output signal and generate a sigma delta PWM signal based on comparing the loop filter output signal to a first hysteresis threshold and to a second hysteresis threshold; and
a feedback path coupled between an output of the hysteresis comparator and the loop filter, wherein the loop filter is configured to receive the sigma delta PWM signal as the feedback signal via the feedback path.

27. The PWM output stage of embodiment 26, wherein:
the hysteresis comparator has a hysteresis level that is greater than a maximum amplitude of the input signal, and an absolute value of the feedback signal is always equal to or greater than an absolute value of the input signal.

28. The PWM output stage of embodiment 26, further comprising:
a controller arranged on a forward control path coupled to the input of the sigma delta loop, wherein the controller is configured to receive the input signal and adjust the first hysteresis threshold and the second hysteresis threshold based on a value of the input signal.

While various embodiments have been disclosed, it will be apparent to those skilled in the art that various changes and modifications can be made which will achieve some of the advantages of the concepts disclosed herein without departing from the spirit and scope of the invention. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:
1. A sigma delta (SD) pulse-width modulation (PWM) loop, comprising:
a loop filter implementing a linear transfer function to generate a loop filter signal, wherein the loop filter is configured to receive an input signal and a first feed- back signal and generate the loop filter signal based on the input signal, the first feedback signal, and the linear transfer function; and a hysteresis comparator coupled to an output of the loop filter, the hysteresis comparator configured to receive the loop filter signal and generate a sigma delta PWM signal based on the loop filter signal, wherein the first feedback signal is derived from the sigma delta PWM signal, and wherein the loop filter comprises:
a combiner circuit configured to receive the input signal and the sigma delta PWM signal, and generate a combined signal having a combined value that is always equivalent to a subtraction of the sigma delta PWM signal from the input signal; and
an integrator configured to receive the combined signal and generate the loop filter signal based on an integration of the combined signal, wherein the hysteresis comparator is configured to receive the loop filter signal and generate the sigma delta PWM signal based on comparing the loop filter signal to a first hysteresis threshold and to a second hysteresis threshold, wherein the first hysteresis threshold is greater than a maximum amplitude of the input signal.

2. The SD PWM loop of claim 1, wherein loop filter comprises at least one of:
at least one integrator,
at least one register,
at least one coefficient multiplier,
at least one inverter,
at least one adder, or
at least one subtractor.

3. The SD PWM loop of claim 1, wherein the loop filter and the hysteresis comparator are digital.

4. The SD PWM loop of claim 1, wherein:
the loop filter comprises an input and a summer arranged at the input, the summer configured to receive the input signal and the first feedback signal and generate the combined signal based on a sum of the input signal and the first feedback signal, wherein the first feedback signal is an inversion of the sigma delta PWM signal.

5. The SD PWM loop of claim 1, wherein:
the loop filter comprises an input and a subtractor arranged at the input, the subtractor configured to receive the input signal and the first feedback signal and generate the combined signal based on a subtraction of the first feedback signal from the input signal, wherein the first feedback signal is the sigma delta PWM signal.

6. The SD PWM loop of claim 1, wherein:
signals inside the loop filter are clamped to values that are defined for maximum and minimum of states to avoid overflows.

7. The SD PWM loop of claim 1, wherein the hysteresis comparator has a hysteresis level that is equal to or greater than a maximum amplitude of the input signal.

8. The SD PWM loop of claim 1, wherein an absolute value of the first feedback signal is always equal to or greater than an absolute value of the input signal.

9. The SD PWM loop of claim 1, wherein:
the hysteresis comparator has a hysteresis level that is greater than a maximum amplitude of the input signal, and
an absolute value of the first feedback signal is always equal to or greater than an absolute value of the input signal.

10. The SD PWM loop of claim 1, further comprising:
a controller arranged on a forward control path, wherein the controller is configured to receive the input signal and adjust the first hysteresis threshold and the second hysteresis threshold of the hysteresis comparator based on a value of the input signal such that the first hysteresis threshold and the second hysteresis threshold are dynamically adjusted while the input signal is received by the loop filter.

11. The SD PWM loop of claim 10, wherein:
the controller is configured to increase the absolute values of the first hysteresis threshold and the second hysteresis threshold in response to a decrease in an absolute value of the input signal, and
the controller is configured to decrease the absolute values of the first hysteresis threshold and the second hysteresis threshold in response to an increase in the absolute value of the input signal.

12. The SD PWM loop of claim 11, wherein:
the sigma delta PWM signal has a variable PWM period that has a minimum duration when the input signal is at zero and has a maximum duration when the input signal is at its maximum or minimum amplitude, and
the controller is configured to dynamically set the absolute values of the first hysteresis threshold and the second hysteresis threshold such that a difference between the minimum duration of the variable PWM period and the maximum duration of the variable PWM period is reduced.

13. The SD PWM loop of claim 10, wherein:
the controller is configured to set absolute values of the first hysteresis threshold and the second hysteresis threshold to a maximum value in response to the value of the input signal being zero, and
the controller is configured to set the absolute values of the first hysteresis threshold and the second hysteresis threshold to a minimum value in response to the value of the input signal having a maximum or minimum amplitude.

14. The SD PWM loop of claim 1, wherein the sigma delta PWM signal has a variable PWM period that has a minimum duration when the input signal is at zero and has a maximum duration when the input signal is at its maximum or minimum amplitude.

15. The SD PWM loop of claim 1, wherein:
the loop filter comprises at least one control input configured to receive control signals, wherein at least one of the control signals is configured to modify a state of the loop filter.

16. The SD PWM loop of claim 15, wherein:
the state of the loop filter includes at least one of holding a value constant, resetting a value to an initial state, or overwriting a value with a new value.

17. The SD PWM loop of claim 1, wherein:
the loop filter comprises at least one control input configured to receive control signals, wherein at least one of the control signals is configured to modify the linear transfer function of the loop filter.

18. The SD PWM loop of claim 17, wherein:
the at least one of the control signals is configured to modify the linear transfer function by changing a filter coefficient of the loop filter, deactivating an element of the loop filter, or bypassing an element of the loop filter.

19. The SD PWM loop of claim 8, wherein the SD PWM loop is a first order loop, and the absolute value of the first feedback signal is always equal to or greater than the absolute value of the input signal.

20. The SD PWM loop of claim 8, wherein the SD PWM loop is a second or higher order loop, and the absolute value of the first feedback signal is always greater than the absolute value of the input signal.

21. The SD PWM loop of claim 1, wherein the hysteresis comparator has a hysteresis level that is greater than a maximum amplitude of the input signal, and the first hysteresis threshold and the second hysteresis threshold are symmetric about a mid-value of the input signal and the hysteresis level is defined by a difference between the first hysteresis threshold and the mid-value.

22. The SD PWM loop of claim 1, wherein the hysteresis comparator has a hysteresis level that is greater than a maximum amplitude of the input signal such that a difference between the first hysteresis threshold and the second hysteresis threshold is always greater than a difference between a maximum amplitude and a minimum amplitude of the input signal.

23. The SD PWM loop of claim 1, wherein the integrator is configured to integrate the combined signal by incrementing or decrementing the loop filter signal by an amount equal to the combined value.

24. The SD PWM loop of claim 23, wherein the hysteresis comparator is configured to generate the sigma delta PWM signal having a variable PWM period that varies inversely relative to the combined value.

* * * * *